US006769919B2

(12) United States Patent
Kosmala

(10) Patent No.: US 6,769,919 B2
(45) Date of Patent: Aug. 3, 2004

(54) LOW PROFILE AND LOW RESISTANCE CONNECTOR

(75) Inventor: Michael Lawrence Kosmala, Mission Viejo, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 10/235,979

(22) Filed: Sep. 4, 2002

(65) Prior Publication Data

US 2004/0043641 A1 Mar. 4, 2004

(51) Int. Cl.[7] .................................................. H05K 1/00
(52) U.S. Cl. ......................................................... 439/66
(58) Field of Search ..................................... 439/91, 66

(56) References Cited

U.S. PATENT DOCUMENTS 6,036,503 A * 3/2000 Tsuchida ..................... 439/70

* cited by examiner

*Primary Examiner*—Hung V. Ngo
(74) *Attorney, Agent, or Firm*—Roger C. Turner

(57) ABSTRACT

A connector includes an insulative housing and rows of contacts with downwardly projecting lower ends soldered to contact pads on a circuit board, which assures engagement of all contact lower ends with all contact pads despite tolerance buildup due to housing warping. Each contact has upper and lower contact elements (50, 52) biased apart by a coil spring (54). When the connector is placed on a circuit board (14), the connector is moved down until spacers (92) on the housing lower surface engage the circuit board and cause the lower ends of all contacts to be upwardly deflected to firmly engage the contact pads for reliably soldering to them. One of the contact elements has a pair of beams (110, 112) that are slideably engaged in a cylindrical hole (130) in the other contact element to assure good electrical contact and to avoid large inductances that would arise if most currents passed through the coil spring.

12 Claims, 3 Drawing Sheets

LOW PROFILE AND LOW RESISTANCE CONNECTOR

BACKGROUND OF THE INVENTION

One type of surface mount connector includes an insulative housing and rows of contacts mounted in the housing. The contacts have lower ends that are connected to contact pads on the upper face of a circuit board, as by soldering thereto. One way to cause the lower ends of all contacts to engage all corresponding contact pads is to precisely machine the lower ends of all contacts so they all lie in the same plane. Then the connector can be pressed down against the circuit board and solder connections made by vapor phase soldering.

One problem encountered with this approach is that the housing sometimes warps, resulting in some contacts lying close to but not against the corresponding contact pads, resulting in poor solder connections. In addition, the cost for precisely machining the lower ends of the contacts to lie in a single plane, can add expense. The upper ends of the contacts often must be resiliently deflectable downwardly to enable connection to another connector or pads of another circuit board by merely pressing them against the upper ends of the contacts. A connector that minimized the cost of connectors of the above-mentioned type and which enabled the connectors to hold a large number of contacts without danger of poor solder connections due to warping of the housing, would be value.

SUMMARY OF THE INVENTION

In accordance with one embodiment of the present invention, a connector system is provided of the type wherein a connector has contacts depending from a connector housing for pressing against contact pads of a circuit board to solder thereto, which assures reliable solder connections despite the use of a long connector housing that may warp, and which minimizes the height and cost of the connector. Each contact has a lower end that is spring-biased downwardly so the lower face of the contact lower end lies at an initial position below the housing main lower surface. The connector housing includes a plurality of spacers that depend from the housing main lower surface by less than the initial projections of the contact lower ends. Accordingly, when the connector is pressed down against a circuit board and fixed to the circuit board, the lower ends of the contacts are resiliently deflected upwardly to a level even with the spacer lower surfaces, thereby assuring that each contact firmly engages one of the contact pads on the circuit board.

Each contact includes upper and lower contact elements and a spring that biases them apart. The housing has passages with conical shoulders that engage corresponding shoulders of the upper and lower contacts to prevent the contacts from moving completely out of the passage. The lower contact element has a narrow upwardly-extending post with a slot dividing it into a pair of beams. The upper contact element has a cylindrical hole, and the beam upper ends lie in the cylindrical hole and are biased apart to make firm contact with the walls of the cylindrical hole, thereby assuring good electrical connection between the upper and lower contact elements. The spring is a helical spring that surrounds the post. By assuring that most current flows through the post instead of the helical spring, applicant avoids the high inductance that would occur if most current passed through the spring.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
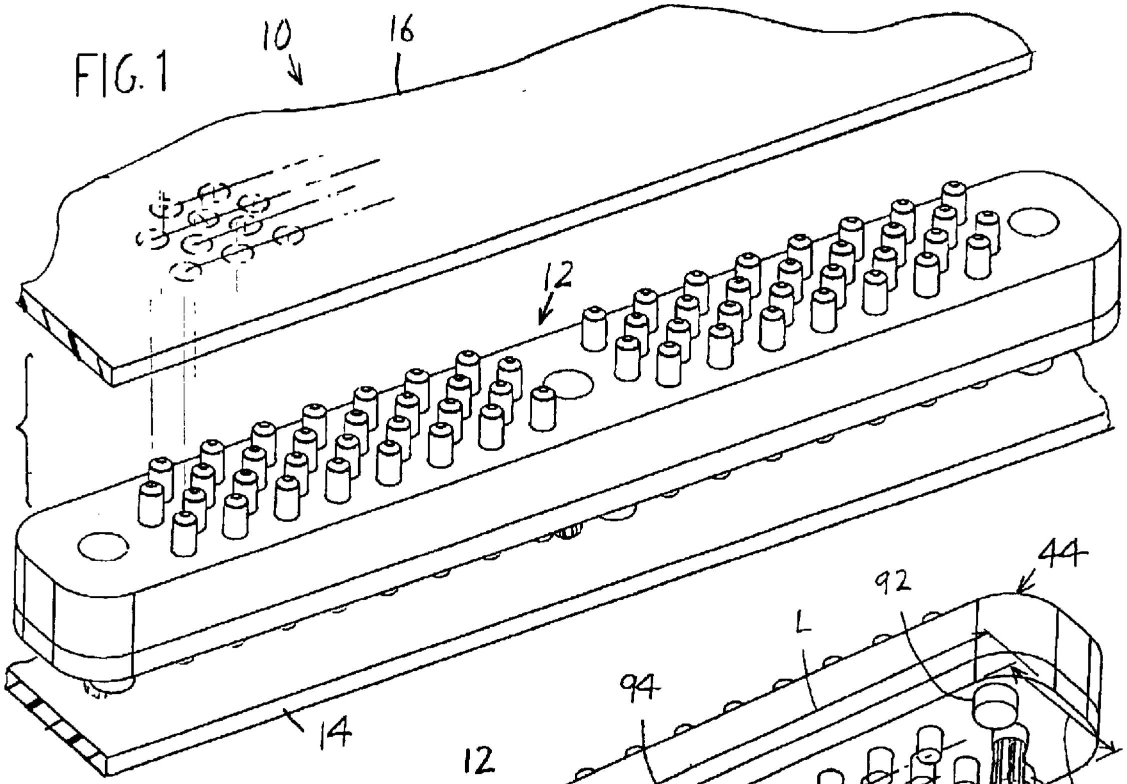
FIG. 1 is an exploded top isometric view showing a connector of the present invention mounted on a lower circuit board, and showing a mating upper circuit board positioned to be lowered against upper ends of contacts of the connector.
Figure 2:
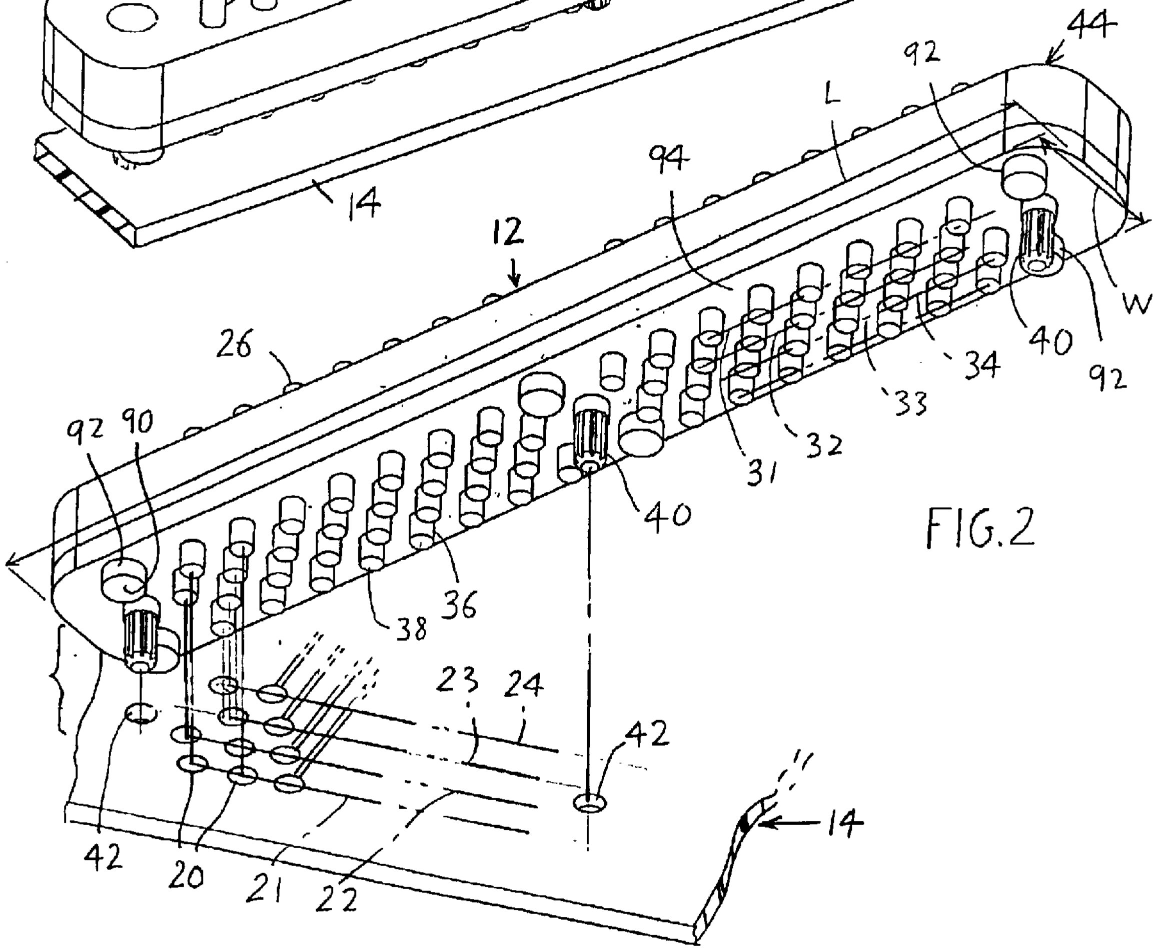
FIG. 2 includes an exploded bottom isometric view of the connector and a top isometric view of a portion of the lower circuit board of FIG. 1.

FIG. 1 illustrates a connector system 10 which includes a connector 12 mounted on a circuit board 14, and showing a second mating connector in the form of a circuit board 16. As shown in FIG. 2, the first circuit board 14 has multiple contact pads 20 arranged in a plurality of rows 21–24. The contact pads are usually very thin (e.g. more than 0.001 inch), so their upper surfaces are substantially flush with the rest of the circuit board. The connector 12 has corresponding contacts 26 arranged in corresponding rows 31–34. In practice, the connector 12 is mounted on the circuit board 14 and contact lower ends 36 are soldered to the contact pads 20 on the circuit board. The connector is fixed in position on the circuit board by a plurality of board mounts 40 that are received in mount holes 42 of the circuit board.

In order for the contact lower ends 36 to be soldered to the contact pads 20, the contact lower end surfaces 38 must engage the contact pads 20, usually with a thin disc of soldering material between them which is heated to complete the soldering operation. In FIG. 2, there are sixty contacts arranged in four rows and thirty staggered columns. One approach of the prior art was to fix at least the lower portions of the contacts in the connector and to precisely machine the contact lower surfaces 38 so they all lay in a common plane. One problem encountered with this approach is that the molded plastic housing 44 which holds the contacts, can warp between the time when the manufacturer machines the lower faces of the contacts and the time when the customer mounts the connector on the circuit board. The connector of the present invention assures that all contacts will engage their corresponding circuit board contact pads, despite warping of the housing 44.

Figure 3:
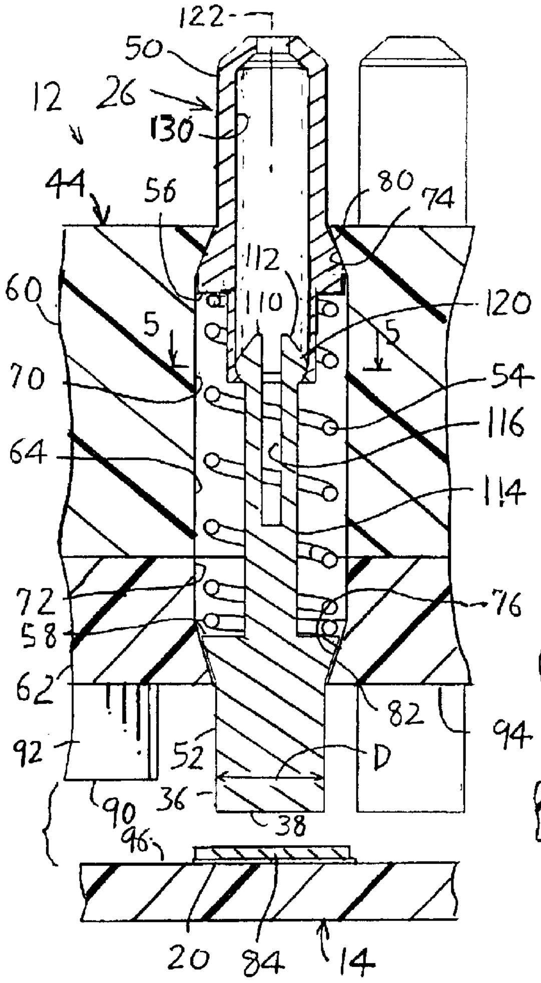
FIG. 3 is a sectional view of the connector of FIG. 2, showing it approaching the lower circuit board of FIG. 2.

FIG. 3 shows details of the connector 12 and of the circuit board 14. Each contact 26 includes upper and lower contact elements 50, 52 and a spring 54. The spring presses against spring-engaging surfaces 56, 58 of the contact elements and biases them apart. The insulative housing 44 has upper and lower housing halves 60, 62 that are each injection molded. The housing has a plurality of passages 64 that each holds one of the contacts, each passage having upper and lower passage portions 70, 72. The contacts are dropped into the passage portions of one housing half, and the housing halves are then brought together and fixed together. Although the spring 54 urges the contact elements 50, 52 apart, they are prevented from moving out of the housing by forming each passage with upper and lower passage shoulders 74,76. Each contact element has a corresponding contact shoulder 80, 82.

FIG. 3 shows the connector 12 with lower end surfaces 38 of the contact lower ends lying above the circuit board 14. A solder disc 84 has been placed on each contact pad 20. Each solder disc 84 includes a mixture of microscopic particles of solder with solder flux. The housing has a main lower surface 94 and has spacers 92 depending from the lower surface. The spacers have lower spaces faces 90. The connector 12 is lowered against the circuit board 14 until the lower spacer faces 90 abut an upper face 96 of the circuit board. The lower end surfaces 58 of the contacts lie below the level of the spacer faces 90, so the contact lower elements 52 are deflected upwardly.

Figure 4:
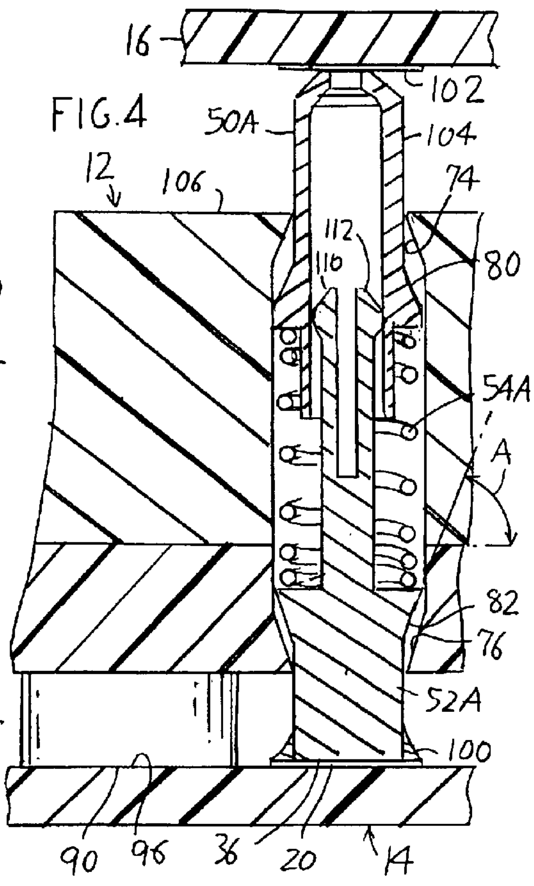
FIG. 4 is a sectional view similar to that of FIG. 3, but with the connector fully lowered against the lower circuit board and with its contacts soldered to circuit board pads, and also showing the upper circuit board of FIG. 1 pressed downward against a contact.

FIG. 4 shows the connector 12 after it has been firmly pressed down towards the circuit board until the spacer lower faces 90 press against the circuit board upper face, and with the contacts soldered to the contact pads 20. The lower contact element at 52A has been deflected upwardly relative to the housing by compression of the spring 54A. With all contact lower end surfaces or faces 38 pressing down against corresponding contact pads 20, the soldered discs are heated by the known vapor phase method, to melt the solder flux and solder of the solder discs and produce a solder joint at 100.

FIG. 4 shows that the upper contact elements have upper ends 104 that project above the housing main upper surface 106. The second mating connector circuit board 16 with contact pads, or conductive traces 102 is shown pressing down against the upper end of the upper contact element 50A and depressing it by further compression of the spring 54A. The connector 12 serves to connect the multiple conductive traces 102 on the mating connector 16 with the multiple contact pads 20 on the circuit board 14. To do this, the upper and lower contact elements 50, 52 must be connected together to transmit current such as high frequency signals between them.

It would be possible to rely upon the spring 54A to transmit high frequency signals between the lower and upper elements 52A, 50A. However, there are two disadvantages in the use of the spring for this purpose. A low cost high performance spring is commonly formed of stainless steel, which has only moderate conductivity compared to brass alloys used for conducting electricity. In addition, the multiple turns of the spring result in high inductance, which is undesirable for high frequency signals. Applicant assures a low resistance connection between the lower and upper contact elements 52A, 50A while minimizing inductance, by the use of a pair of beams 110, 112 formed on the lower contact element 52A.

As shown in FIG. 3, the lower contact element is machined with a post 114 that extends upward from the larger diameter lower end 52. The post has an upper end with a slot 116 that divides the post upper end into the pair of beams. Each beam has a projection 120 that projects radially outwardly with respect to an axis 122 of the contact and passage. The upper contact element 50 is formed with a largely cylindrical hole, or bore 130 that receives the upper ends of the beams. The beams tend to assume a position where the projections 120 are spaced apart by more that the diameter of the bore 130, so the walls of the bore 130 deflect the beams closer together, thereby assuring pressure contact between the beam projections 120 and the walls of the bore 130. The beam projections lie in a sliding fit, or in sliding contact, with the walls of the bore so the beams can slide up and down within the bore of the upper contact element, while remaining in low resistance engagement with the upper contact element. The upper and lower contact elements are formed of a low resistance metal such as a low resistance brass alloy, which assures low resistance contact.

Figure 5:
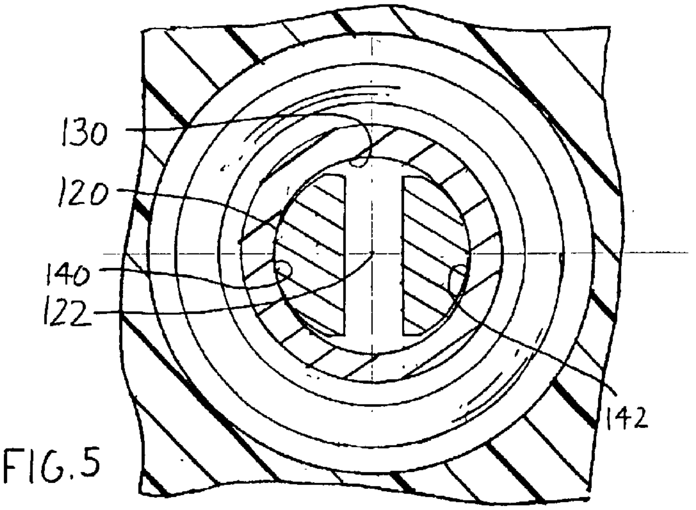
FIG. 5 is a sectional view taken on line 5—5 of FIG. 3.
Figure 6:
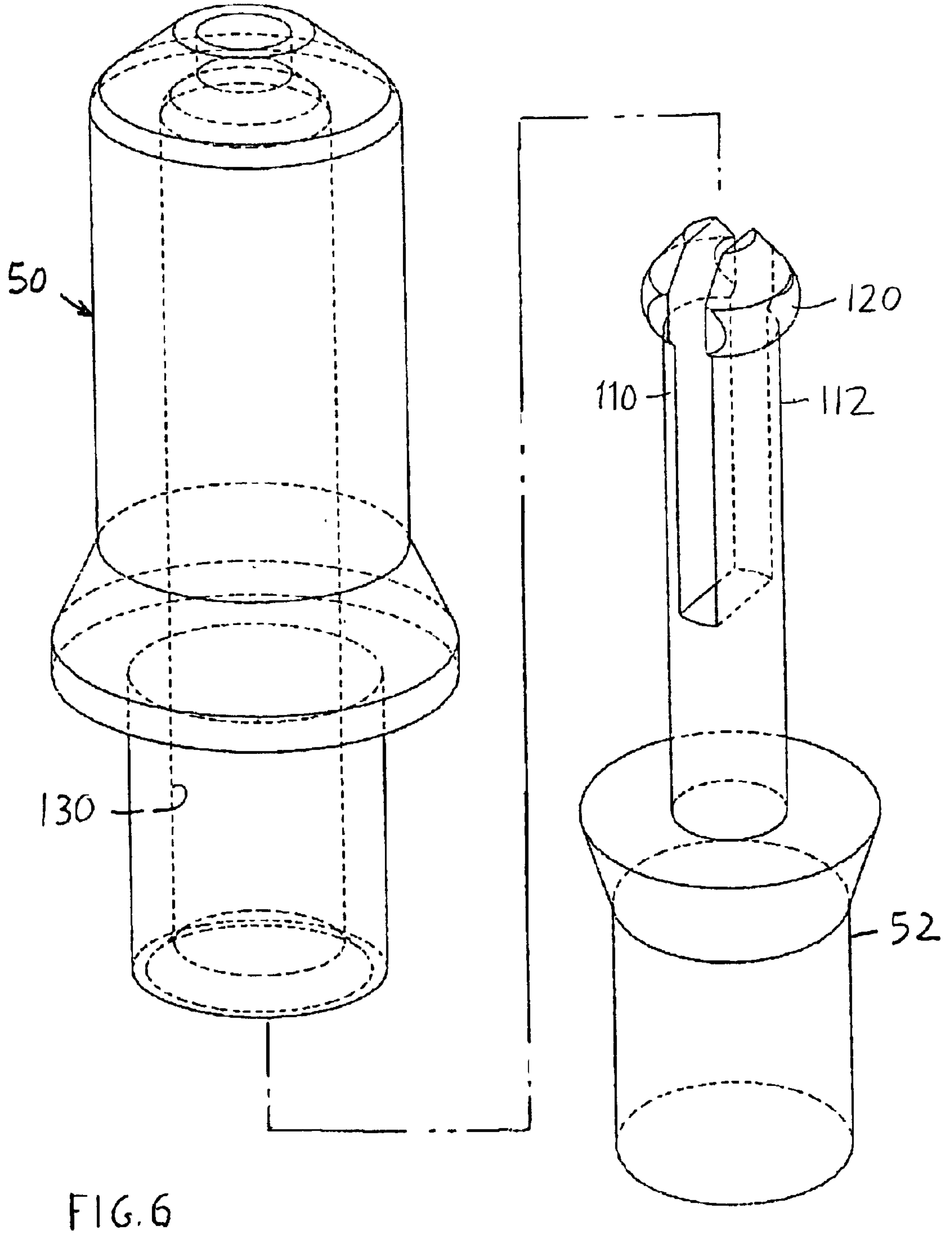
FIG. 6 is an exploded isometric view of the upper and lower contact elements of the connector of FIG. 3.

FIG. 5 shows that the beam projections 120 form large area contact with slide surface portions 140, 142 of the walls of the hole 130. This is achieved by forming the projections 120 with a radius only slightly less (within 20%) than the radius of the bore 130.

FIG. 4 shows the upper and lower housing shoulders 74, 76 are conical, and extend at an angle A of about 70 degrees from the horizontal. The corresponding contact element shoulders 80, 82 are similarly angled. It would be possible to instead have shoulders extending horizontally, but this would require more expensive machining of the contact elements, and would require a somewhat thicker housing or result in shoulder walls that were not robust against breaking.

In a system that applicant has designed, and which is illustrated, the connector housing had an overall length L (FIG. 2) of 46.5 mm (1.83 inches) a width W of 6 mm (0.24 inch) and a thickness T of 44 mm (1.74 inches), and had sixty contacts. Each contact had a flat lower surface with a diameter D (FIG. 3) of 0.84 mm (0.033 inch) and the contacts were spaced apart along each row by 1.5 mm (0.059 inch) with other dimensions being proportional to those given, as is illustrated in FIGS. 3 and 4.

Although terms such as “up”, “down” etc. having been used to describe the invention as it is illustrated, it should be understood that the connector can be used in any orientation with respect to the Earth.

Thus, the invention provides a connector and connector system, of a type wherein the lower ends of contacts are soldered to contact pads on a circuit board, which assures that all contacts will be reliably soldered to the corresponding contact pads, especially when vapor phase soldering is used, and with the contacts having upper and lower contact elements connected in a low resistance connection of minimum inductance. The insulative housing of the connector has a main lower face and has spacers extending downward therefrom, the spacers having spacer lower faces that engage the circuit board. Each contact has a lower contact element that is spring biased to an initial downward position wherein the lower surface of the contact lies lower than the lower surfaces of the spacers. When the connector housing is pressed downward towards the circuit board, the contact lower elements are resiliently deflected upwardly to lie in the same plane as the lower surfaces of the spacers, thereby assuring that all contact element lower faces engage the corresponding circuit board contact pads, and thereby assuring reliable solder joints. The upper contact element is preferably resiliently biased upwardly but can be downwardly deflected. Although a spring biases the lower contact element downwardly, and usually also biases the upper contact element upwardly, electrical connections between the elements are not primarily through the spring. Instead, the connections are made through a plurality of beams extending from a contact element such as the lower one, the beams being slideably engaged with a surface of the other element, as where a pair of beams on the lower contact element lie in a cylindrical bore in the upper contact element and are biased firmly against the walls of the bore. The lower contact element has a conical shoulder that engages a corresponding conical shoulder of the lower housing half of the connector.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A connector system which includes a connector with an insulative housing having a plurality of passages, and a plurality of contacts lying in said passages, wherein:

said housing includes upper and lower housing halves, each forming a portion of each passage, said upper and lower housing halves respectively forming largely downwardly and upwardly facing conical passage shoulders that prevent loss of a contact;

each contact has upper and lower contact elements and a spring that urges them apart, each contact element having a conical contact shoulder that can abut a corresponding one of said conical passage shoulders;

a first of said contact elements has a plurality of largely vertically-extending beams and a second of said contact elements has largely vertically-extending slide surface portions, said beams pressing against said slide surface portions and being vertically slideable therealong.

2. The connector system described in claim 1 wherein:

each of said passage shoulders and contact shoulders extends at least 45° from the horizontal.

3. The connector system described in claim 1 wherein:

each of said passage shoulders and contact shoulders extends at least 60° from the horizontal.

4. A connector system which includes a connector with an insulative housing having a plurality of passages, and a plurality of contacts lying in said passages, wherein:

said housing includes upper and lower housing halves, each forming a portion of each passage, said upper and lower housing halves respectively forming largely downwardly and upwardly facing passage shoulders that prevent loss of a contact;

each contact has upper and lower contact elements and a spring that urges them apart, each contact element having a contact shoulder that can abut a corresponding one of said passage shoulders;

a first of said contact elements has a plurality of largely vertically-extending beams and a second of said contact elements has largely vertically-extending slide surface portions, said beams pressing against said slide surface portions and being vertically slideable therealong;

said slide surface is the surface of primarily cylindrical bore, and said second contact element has a large diameter lower end and has a post of smaller diameter than said lower end and projecting upward therefrom, said post having an upper portion divided into said plurality of beams with rounded ends that are biased apart and that lie in said cylindrical bore, said spring being a helical spring that extends around said post.

5. A connector system which includes a connector with an insulative housing having a plurality of passages, and a plurality of contacts lying in said passages, wherein:

said housing includes upper and lower housing halves, each forming a portion of each passage, said upper and lower housing halves respectively forming largely downwardly and upwardly facing passage shoulders that prevent loss of a contact;

each contact has upper and lower contact elements and a spring that urges them apart, each contact element having a contact shoulder that can abut a corresponding one of said passage shoulders;

a first of said contact elements has a plurality of largely vertically-extending beams and a second of said contact elements has largely vertically-extending slide surface portions, said beams pressing against said slide surface portions and being vertically slideable therealong;

said plurality of passages and contacts lie in a plurality of rows and said housing has a lower main surface, and including a circuit board having an upper surface and having a plurality of rows of contact pads lying on said upper surface and arranged in a pattern corresponding to said rows of contacts; and wherein said housing has a plurality of spacers extending downward from said housing main surface and having spacer lower surfaces lying against said board upper surface, said circuit board has a plurality of mount holes and said housing has a plurality of mounts projecting into and fixed in said mount holes, and said contacts are positioned with the lower contact element of each contact deflected upward so its contact shoulder is out of abutment with a corresponding passage shoulder, each lower contact element having a substantially flat lower surface soldered to one of said contact pads.

6. A connector system which includes a connector with an insulative housing having a main lower surface and a plurality of contact-holding passages, and a plurality of contacts lying in said passages and having lower ends with contact lower surfaces, said contact lower ends projecting downward from the housing main lower surface, the system including a circuit board having an upper surface with a plurality of flat contact pads arranged to engage said contact lower surfaces and to be soldered to said contact lower ends, said connector housing having a plurality fixed of board-engaging spacers projecting downward from the main lower surface, said spacers having spacer lower surfaces lying in a spacer first plane, each of said contact lower ends is spring biased downwardly to a position wherein its contact lower end lies below said spacer first plane, but said contact lower ends being resiliently deflectable upwardly with respect to said housing, wherein:

said contact lower surfaces are primarily flat, and said connector housing has a plurality of board mounts that fix said connector housing to said circuit board at a position wherein said spacer lower surfaces and said contact lower surfaces lie against said board upper face.

7. The connector system described in claim 6 wherein:

each of said contacts includes lower and upper contact elements and a spring that biases them apart, said housing having shoulders that prevent said lower and upper contact elements from respectively moving down or up completely out of the corresponding housing passage;

a first of said contact elements has a plurality of beams and a second of said contact elements has primarily vertically extending slide surface portions, each of said beams being slideably engaged with one of said slide surface portions, whereby to electrically connect said contact elements with minimum inductance.

8. The connector described in claim 7 wherein:

each of said contacts includes lower and upper elements having spring-engaging surfaces that face each other, said spring comprises a coil spring that extends between said spring-engaging surfaces, said second contact element has a largely cylindrical bore, and said plurality of beams lie at least partially within said coil spring and project into said cylindrical bore and are deflected towards each other by walls of said cylindrical bore.

9. A connector system which includes a connector with an insulative housing having a plurality of passages, and a plurality of contacts lying in said passages, wherein:

said housing forms largely downwardly and upwardly facing passage shoulders that prevent loss of a contact;

each contact has upper and lower contact elements and a spring that urges them apart, each contact element having a contact shoulder that can abut a corresponding one of said passage shoulders;

a first of said contact elements has a plurality of largely vertically-extending beams and a second of said contact elements has largely vertically-extending slide surface portions, said beams pressing against said slide surface portions and being vertically slideable therealong.

10. The connector described in claim 9 wherein:

each of said contacts includes lower and upper elements having spring-engaging surfaces that face each other, said spring comprises a coil spring that extends between said spring-engaging surfaces, said second contact element has a largely cylindrical bore, and said plurality of beams lie at least partially within said coil spring and project into said cylindrical bore and are deflected towards each other by walls of said cylindrical bore.

11. The connector system described in claim 9 wherein said housing has opposite housing surfaces, and wherein:

each of said contact elements of a contact is slideable in the corresponding passage, and said spring biases each contact element to project from a different one of said housing surfaces.

12. A method for mounting on a circuit board, a connector having a housing with a lower main surface and a plurality of rows of passages, and having a plurality of contacts each mounted in one of said passage with each contact including a lower contact end projecting below the lower main surface, wherein the circuit board has a plurality of rows of contact pads, the method including soldering said lower ends of the contacts to the contact pads, comprising:

establishing the contacts in the passages so each contact lower end is resiliently biased downward, with a lower surface of the contact lower end lying a predetermined first distance below said housing main lower surface;

moving the housing down against the circuit board until spacers that are fixed to a rest of the housing and that depend from said housing main lower surface and that have spacer lower surfaces that lie in a spacer plane that is spaced a second distance that is less than said first distance from said lower main surface, abut said circuit board upper surface, while said contact lower ends are resiliently deflected upward until said contact lower surfaces lie in said spacer plane, and fixing said housing to said circuit board;

with said housing fixed to said circuit board, performing said step of soldering said contact lower ends to said contact pads.

* * * * *